United States Patent
Davis et al.

(10) Patent No.: US 10,641,833 B2
(45) Date of Patent: May 5, 2020

(54) METHOD OF SCREENING HIGH RATE ELECTROCHEMICAL CELLS

(71) Applicant: Pacesetter, Inc., Santa Clara, CA (US)

(72) Inventors: Steven Davis, Greer, SC (US); Xiaofei Jiang, Clemson, SC (US); Joseph Beauvais, Liberty, SC (US)

(73) Assignee: Pacesetter, Inc., Sylmar, CA (US)

( * ) Notice: Subject to any disclaimer, the term of this patent is extended or adjusted under 35 U.S.C. 154(b) by 197 days.

(21) Appl. No.: 15/816,198

(22) Filed: Nov. 17, 2017

(65) Prior Publication Data

US 2018/0143255 A1 May 24, 2018

Related U.S. Application Data (60) Provisional application No. 62/424,064, filed on Nov. 18, 2016.

(51) Int. Cl.
*G01R 31/385* (2019.01)
*G01R 31/36* (2020.01)
*G01R 31/392* (2019.01)

(52) U.S. Cl.
CPC ....... *G01R 31/385* (2019.01); *G01R 31/3648* (2013.01); *G01R 31/3865* (2019.01); *G01R 31/392* (2019.01)

(58) Field of Classification Search
CPC .............. G01R 31/385; G01R 31/3865; G01R 31/3648
See application file for complete search history.

(56) References Cited

U.S. PATENT DOCUMENTS

| | | | |
|---|---|---|---|
| 5,180,462 A | | 1/1993 | Dailliez et al. |
| 5,432,452 A | * | 7/1995 | Fiorina ............... G01R 31/3648 324/427 |
| 5,472,810 A | | 12/1995 | Takeuchi et al. |
| 5,563,494 A | * | 10/1996 | Cuesta .................. H02J 7/0091 320/150 |
| 6,171,723 B1 | | 1/2001 | Loch et al. |
| 6,174,622 B1 | | 1/2001 | Thiebolt, III et al. |
| 6,274,265 B1 | * | 8/2001 | Kraska .............. H01M 10/4285 429/48 |

(Continued)

OTHER PUBLICATIONS

Faster and Better: A Machine Learning Approach to Corner Detection, IEEE Transactions on Pattern Analysis and Machine Intelligence, vol. 32 Issue 1, Jan. 2010, pp. 105-119.

(Continued)

*Primary Examiner* — Michael J Dalbo (57) ABSTRACT

A method of screening a battery for failure mechanisms is provided. The method may include activating an electrochemical cell. Within 5 minutes to two hours of activating the cell, the open circuit voltage of the cell is measured over a period of time to determine a voltage versus time function. The cell is then screened for the presence of a failure mechanism by checking the voltage versus time function for a failure criteria.

18 Claims, 7 Drawing Sheets

(56) References Cited

U.S. PATENT DOCUMENTS

| | | | |
|---|---|---|---|
| 6,551,747 B1 | 4/2003 | Gan | |
| 6,552,511 B1 | 4/2003 | Fayram | |
| 6,582,545 B1 | 6/2003 | Thiebolt, III et al. | |
| 7,252,797 B2 | 8/2007 | Panzer et al. | |
| 7,651,647 B1 | 1/2010 | Strange et al. | |
| 7,820,328 B1 | 10/2010 | Takeuchi et al. | |
| 9,072,993 B2 | 7/2015 | Inui et al. | |
| 9,295,844 B2 | 3/2016 | Jiang et al. | |
| 9,368,829 B2 | 6/2016 | Bruch | |
| 2005/0014036 A1* | 1/2005 | Kim | H01M 2/021 429/7 |
| 2007/0093701 A1* | 4/2007 | Myers | A61B 5/0059 600/323 |
| 2010/0114235 A1 | 5/2010 | Jiang et al. | |
| 2015/0043805 A1* | 2/2015 | Sakamoto | G06T 7/0004 382/151 |
| 2016/0146895 A1* | 5/2016 | Yazami | B60L 58/34 324/426 |
| 2017/0309953 A1* | 10/2017 | Harayama | H01M 10/0525 |
| 2018/0236890 A1* | 8/2018 | Cyrne | B60L 3/12 |

OTHER PUBLICATIONS

Computer Vision—ECCV 2006: 9th European Conference on Computer Vision, Graz, Austria, May 7-13, 2006, Proceedings, Part III (Lecture Notes in Computer Science) 2006th Edition, Machine Learning for High-Speed Corner Detection, Edward Rosten and Tom Drummond, p. 430-441.

Battery University, "BU-304A; Safety Concerns with Li-ion", https://batteryuniversity.com/learn/article/safety_concerns_with_li_ion, Apr. 23, 2019.

Gordon-Bloomfield, "How Nissan Makes its Electric Car Battery Packs, Part One of Three: On Being Super-Clean", https://web.archive.org/web/20160730052109/https://transportevolved.com/2014/12/02/nissan-makes-electric-car-battery-packs-part-one-three-super-clean.

Hudec et al., "Spontaneous explosion of implantable cardioverter-defibrillator", Europace Advance Access, Published Sep. 27, 2010.

Sato et al., "Rapid Detection and Element Identification of Fine Metal Particles for Underpinning Battery Quality," Hitachi Review, vol. 65, 2016, No. 7, pp. 100-104.

\* cited by examiner

METHOD OF SCREENING HIGH RATE ELECTROCHEMICAL CELLS

This application claims the benefit of U.S. Provisional Application No. 62/424,064, filed Nov. 18, 2016, entitled, "METHOD OF SCREENING HIGH RATE ELECTROCHEMICAL CELLS," the contents of which are incorporated by reference herein in their entirety.

BACKGROUND

Due to their particular characteristics, several types of electrochemical cells are desirable for use in implantable medical devices (IMDs) that require power, such as implantable cardioverter defibrillators (ICDs) and cardiac pacemakers. When a device is replaced due to battery depletion or other issues, the replacement process involves surgery. This surgery can be in a sensitive area, for example, near or in the human heart. Moreover, the life of a user may depend upon proper battery operation. So, improvement to the reliability, performance, and lifetime of electrochemical batteries is highly desirable.

Manufacturing of batteries for medical devices should be robust, repeatable, and result in consistent battery performance. But, most real world manufacturing processes have a yield rate less than 100%—some of the batteries manufactured will include a failure mechanism that renders the battery unsuitable for use. It is desirable to be able to screen batteries for the presence of failure mechanisms in a non-destructive manner.

SUMMARY

In some embodiments, a method of screening a battery is provided.

In some embodiments, the method may include activating an electrochemical cell. After activating the cell, the open circuit voltage of the cell is measured over a period of time to determine a voltage versus time function. The cell is then screened for the presence of a failure mechanism by checking the voltage versus time function for a failure criteria.

In some embodiments, the period of time starts immediately after, or shortly after, the cell has been activated.

In some embodiments, the period of time starts after the cell has reached thermal equilibrium and after the cell has been activated. The time to reach thermal equilibrium (if different than the fill temperature) depends upon the mass of the cell the temperature difference between activation and burn-in, and the rate of heat transfer from the cell to the environment. The time to reach thermal equilibrium can be determined experimentally for an electrochemical system by examining the voltage versus temperature and time curve to determine when it stabilizes for the system being studied. It is desirable to equilibrate the cell at final temperature as quickly as possible following cell activation.

In some embodiments including rechargeable cells, the open circuit voltage of the cell is measured after the cell has reached thermal equilibrium and has been activated, and after initially charging the cells from a discharge state to the highest operational cell voltage.

In some embodiments, the cell may be incorporated into an implantable medical device, or other apparatus, only if the failure criteria is absent from the voltage versus time function. If the failure criteria is present in the voltage versus time function, the cell may be discarded, recycled, or subject to further screening.

In some embodiments, the failure criteria may be the presence of a first order discontinuity in the voltage versus time function.

In some embodiments, the voltage versus time function is checked for the failure criteria by calculating the second derivative of the voltage versus time function. The failure criteria is met where the absolute value of the second derivative exceeds, at any point in the period of time, 0.15 $V/sec^2$ in one embodiment, 0.19 $V/sec^2$ in another embodiment, or exceeds 1.0 $V/sec^2$ in yet another embodiment. In some embodiments, the failure criteria is met where the absolute value of the second derivative exceeds, at any point in the period of time, three times the one-sigma variation of an average passing sample. In some embodiments, the failure criteria is met where the absolute value of the second derivative exceeds, at any point in the period of time, six times the one-sigma variation of an average passing sample.

In some embodiments, the voltage versus time function is checked for the failure criteria by filtering the second derivative. In some embodiments, the second derivative is filtered using a linear time invariant low pass filter. In some embodiments, the failure criteria is met where the absolute value of the filtered second derivative exceeds one $V/sec^2$ at any point in time.

In some embodiments, the first derivative of the voltage versus time function may also be calculated and/or filtered, and checked for a failure criteria.

In some embodiments, the time period for taking measurements is at least 10,000 seconds long. In some embodiments, the time period for taking measurements is at least 20,000 seconds long. In some embodiments, the time period is at least 10,000 seconds long, and not more than 100,000 seconds long.

In some embodiments, the voltage versus time function is determined by measuring the open circuit voltage of the cell at least 100 different times within the time period. For example, open circuit voltage may be measured once per second for a time period of 10,000 seconds, for a total of 10,000 measurements.

DETAILED DESCRIPTION OF THE INVENTION

Lithium silver vanadium oxide (SVO) cells have been the battery cell of choice for high rate active implantable grade cells for over 35 years. Product performance is directly impacted by the physical properties of the cell, and also how these properties interact with various design parameters to affect performance. The terms "battery," "cell," and "electrochemical cell" are used interchangeably. Exemplary battery cells are described in U.S. Patent Publication No. 2010/0114235, entitled "Hybrid battery system for implantable cardiac therapy device," U.S. Pat. Nos. 5,472,810, 6,551,747, 5,180,462, 6,552,511, 9,295,844, 7,651,647, and 9,368,829, each of which is incorporated herein by reference in their entirety.

Electrochemical cells are typically manufactured by first assembling all of the components except the electrolyte. Then, the electrolyte is added, which "activates" the cell. Once activated, the cell generates a voltage between its terminals. This voltage typically decreases from a relatively high initial voltage to a relatively constant lower voltage following electrolyte activation. Voltage is typically first measured as "open circuit" voltage ("OCV"), which is the voltage between the two terminals of a battery when they are not connected to a load. Open circuit voltage (used interchangeably herein with "open cell voltage") may be measured, for example, by a voltmeter that does not allow significant current to flow as the measurement is taken. During this open circuit storage, electrolyte is reaching the different areas of the cathode, a passivation layer is forming on the anode, and any materials that are not oxidatively stable at the cathode voltage are being consumed through oxidation followed by dissolution into the electrolyte as positive ions. As those materials dissolve, and if they are a different voltage than the host cathode material, there may be an observable signature in the open circuit voltage of the cell. Following OCV storage, the cells are placed on a resistive load which removes some small amount of capacity from the cell. This step provides a measurement of cell performance under load, and also provides a fresh surface at the anode for further passivation and reaction during discharge.

Implantable grade electrochemical cells may be screened for multiple failure mechanisms. One way to screen is to take a single voltage measurement after the cell is activated and after burn-in, i.e., when the cell has reached a relatively constant open circuit voltage. Such a screening will show whether the cell is operating at the time it is tested at the voltage expected for the cell after burn-in. This screening is commonly done with rechargeable cells, where the cells can be cycled and then charged to a constant voltage which can be monitored over days or weeks. Another screening mechanism is based on a voltage measurement taken after burn-in and after a storage period, which may be referred to as an "acceptance pulse." Such screening is quick and easily implemented, and will reveal some types of defects in the cell. But, such screening may miss other types of defects.

Some failure mechanisms for electrochemical cells are caused by the presence of unwanted foreign materials (i.e., contaminants) within the cell. These particles can originate from any source encountered during production, e.g., a metal source, and may cause failure via two main mechanisms. In the first mechanism, the conductive particles form a short-circuit (i.e., a conductive path) directly through the battery separator, resulting in rapid and possibly uncontrolled self-discharge. In the second mechanism, the particles may dissolve at the electrochemical potential of the cathode, and then redeposit (or reform) at the electrochemical potential of the anode, growing a conductive bridge slowly across the cell stack towards the cathode, eventually forming a short-circuit. The short may develop over time, sometimes after months of use. Depending on the extent of contamination, this type of failure mechanism may be present, but not detectable, with a single voltage measurement, or a limited number of voltage measurements. A limited number of voltage measurements may be insufficient to detect the effect of failure mechanisms on the characteristics of a voltage versus time function as described herein. Furthermore, the failure mode will be most easily detected when the foreign material is present on the high voltage cathode of the cell, where the voltage instability is more easily observed (compared to the lower voltage anode).

It is desirable to not only reduce the chance of cells being contaminated during production via foreign contaminants, but also to develop screening methods for detecting cells that have been contaminated. Screening methods may include electrochemical testing and electrical test observation. This disclosure describes methods for detecting foreign contaminants, e.g., metal particle defects, during cell burn-in, prior to acceptance pulse. The method involves measuring open cell voltage during burn-in at many points in time, in order to observe open cell voltage as a function of time.

Figure 1:
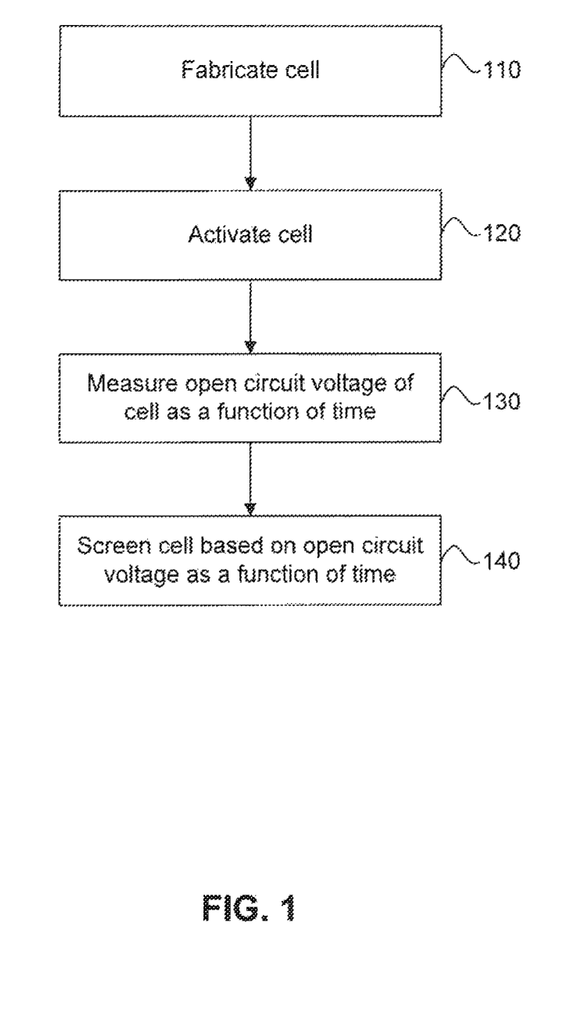
FIG. 1 shows a flowchart of a method of screening a battery for a failure mechanism.

FIG. 1 shows a flowchart of a method of screening a battery for a failure mechanism. In a first step 110, the cell is fabricated. In a second step 120, the cell is activated. Steps 110 and 120 are optional, in the sense that they need not be performed by the person practicing the method of screening. In a third step 130, the open circuit voltage of the cell is measured as a function of time. In a fourth step 140, the open circuit voltage of the cell as a function of time is checked for the presence of a failure criteria. The cell may then be treated differently depending on whether the failure criteria is present—passed as acceptable for use if the failure criteria is absent, or failed and discarded or recycled if the failure criteria is present.

It has been discovered that certain failure mechanisms have a strong correlation with particular characteristics of open cell voltage as a function of time during cell burn-in. Specifically, the open cell voltage as a function of time for a cell without such defects does not have first order discontinuities. The same function for a cell with a failure mechanism will have a first order discontinuity. A "first order discontinuity" may be visible, for example, as a sudden change in the slope of the open cell voltage versus time curve. A first order discontinuity may be observed as a change in the value of the first derivative of the open cell voltage versus time curve, or as a spike in the value of the second derivative of the open cell voltage versus time curve. Such a spike may be accentuated for easier observation or easier comparison to a failure criteria by filtering the second derivative of the open cell voltage versus time curve, using a suitable filter such as a linear time invariant low pass filter.

Cell fabrication (first step 110) and activation (second step 120) may be performed by any suitable method. Exemplary cell fabrication is described in U.S. Pat. Nos. 5,472,810, 6,551,747, 5,180,462, 6,552,511, 9,295,844, 7,651,647, and 9,368,829, each of which is incorporated by reference herein in its entirety.

In some embodiments, following cell fabrication and activation with electrolyte, the electrochemical cells, e.g., Lithium SVO cells, are quickly attached to a voltmeter or other voltage measuring device so that the voltage of the cell may be measured during burn-in. In an automated system, the electrochemical cell may be attached to a voltmeter or other voltage measuring device during activation of the cell, and the voltmeter or other voltage measuring device may be initiated immediately after, or soon after, activating the cell, so that the voltage of the cell may be measured during burn-in. During this procedure, cell open circuit voltage is typically measured for an extended period of time of 24 hours or more. During this period, cell voltage is expected to decay along a uniformly curved path.

Discontinuities, or changes in slope of this path, indicate that foreign contaminants may be present within the cell or that other problems with the hold procedure have occurred such as changes in temperature, or external shorts. These discontinuities can sometimes be seen visually in a plot of voltage versus time, but also can be found via numerical analysis of the raw data including a filtering step.

In a third step 130, the open circuit voltage of the cell is measured as a function of time. This measurement may be performed in any way that obtains the voltage data as a function of time for a period of time. For example, a voltmeter with storage or plotting capability, or a voltmeter attached to a computer, may be used to measure voltage at many different points in time, and record each voltage-time point. The period of time over which measurements occur should be during burn-in of the cell, i.e., while the voltage is still dropping from a relatively high voltage value that occurs immediately after the cell is activated by adding electrolyte. The period of time should start as soon as possible after activation, but preferably after temperature equilibrium is reached. For example, the period of time should start within 0.1, 1, 2, 3, 4 or 5 hours of activation, or within any range having any two of these values as endpoints. Starting the measurement too quickly after activation may lead to unreliable measurements before the cell reaches temperature equilibrium. If the cell is not in temperature equilibrium, temperature variation may cause voltage fluctuations that lead to a false positive for a failure mechanism. In some embodiments, measurements may be made quickly after activation, but the measurements made before temperature equilibrium is reached would not be used in some of the calculations described herein. Starting the measurement too long after activation risks missing the data in which a failure criteria may be observed. If the amount of foreign material is very small, the signature may be observable only immediately after the cell has been activated.

In certain embodiments, e.g., in an automated system, the electrochemical cell is brought to thermal equilibrium, e.g., 37° C., prior to activating the cell. The amount of time necessary to bring the electrochemical cell to thermal equilibrium may vary as a function of cell size, where larger cells will take longer than smaller cells to reach thermal equilibrium. Reaching thermal equilibrium prior to activating the cell advantageously permits electrolyte to flow more efficiently into the cell, enabling a more consistent filling of the cell, such that the amount of electrolyte is consistent between batches. Reaching thermal equilibrium prior to activating the cell also advantageously permits faster initiation of measurements of the open circuit voltage of the cell, e.g., permitting more reliable measurements of the open circuit voltage immediately after activation of the cell, thus permitting the detection of even very small contaminants.

The time period for open circuit voltage measurements should last, for example, 2,500, 5,000, 10,000, 20,000, 30,000, 40,000, 60,000, 80,000, 100,000 or 200,000 seconds, or within any range having any two of these values as endpoints. Measuring for too short a time period risks missing the data in which a failure criteria may be observed. Measuring for too long a time period may be unneeded as the failure criteria are usually evident relatively quickly. Measuring for a time period that is too long increases the time and cost of testing.

In one embodiment, it is preferred to measure starting the open circuit voltage within 5 minutes (300 seconds) after activation, for a time period of 23 hours and 55 minutes (86,100 seconds), i.e., until 24 hours after activation.

In one embodiment, it is preferred to measure starting one hour (3,600 seconds) after activation, for a time period of 23 hours (82,800 seconds), i.e., until 24 hours after activation.

In some embodiments, a voltage measurement is taken every 0.1, 1, 5, 10, 20, 30, 40, 50, 60, 120, 240, 360, 480 or 600 seconds, or within any range having any two of these values as endpoints. In one embodiment, it is preferred to measure voltage every 1 to 60 seconds. Measuring too infrequently may make the failure criteria more difficult to detect in the data. Measuring too frequently may not add any benefit, and may increase data file sizes.

In some embodiments, at least 100 measurements of open circuit voltage are taken during burn-in. The number of measurements taken may be, for example, 100, 500, 2,500, 5,000, 10,000, 20,000, 30,000, 40,000, 60,000, 80,000, 100,000 or 200,000, or within any range having any two of these values as endpoints. Taking too few measurements may result in a data set in which the discontinuities discussed herein cannot be seen. Taking too many measurements may not add any benefit, and may increase data file sizes.

In certain embodiments, wherein the electrochemical cell is a rechargeable cell, the open cell voltage of the cell is measured after the cell has reached thermal equilibrium and has been activated, and after initially charging the cells from a discharge state to the highest operational cell voltage.

In some embodiments, once data is obtained for open cell voltage as a function of time for a cell during burn-in, screening may be conducted in any number of ways. One way is to check the data for the presence of a first order discontinuity. Checking for the presence of a first order discontinuity may be conducted in any number of ways. First order discontinuities in the raw data are usually recognizable to one of skill in the art based on simply visually inspecting (i.e., looking at) a plot of the data (open cell voltage versus time), and visually detecting a change in slope. Similarly, the first and second derivatives versus time of the data plot may be visually checked for the presence of a first order discontinuity, as a sudden change in value of the first derivative, or a spike in the second derivative. In addition to visual inspection, a first order discontinuity may be detected by numerical analysis and/or filtering techniques.

The method of screening a battery for a failure mechanism has been experimentally demonstrated. A total of 528 cells were tested. Eight cells showed failure criteria. All eight were destructively analyzed via destructive physical analysis and found to have metal contaminants. Similarly, the method has been experimentally demonstrated to indicate cells not containing metal contaminants, as determined by destructive physical analysis, as not meeting a fail criteria, i.e., meeting a pass criteria. Five cells which passed were destructively analyzed, and found not to have metal contaminants.

Destructive physical analysis is not desirable for testing battery cells in a production run, because any cells so tested are no longer usable. But destructive physical analysis is highly useful to show that certain characteristics of the non-destructive measurement of voltage versus time correlate with the presence of failure mechanisms apparent from destructive physical analysis. This showing validates the use of a voltage versus time measurement to screen for defective cells.

Based on the data in the examples, a reasonable failure criteria in one embodiment is whether the absolute value of the filtered second derivative exceeds 0.15 V/sec$^2$. Other reasonable failure criteria in other embodiments is whether the absolute value of the filtered second derivative exceeds 0.19 V/sec$^2$ or 1.0V/sec$^2$. The failure criteria for a specific cell geometry may be based upon experience viewing data for the cell geometry, and/or statistical analysis of a number of samples. The number may be affected by a plurality of factors, such as the characteristics of the specific cell being measured, the frequency of data sampling, and the length of time during burn-in over which data is sampled. For any particular battery, and any sufficiently frequent measurement during burn-in, a reasonable failure criteria that quickly and easily distinguishes samples with and without metal contaminants may be determined by measuring and destructively analyzing a number of samples as described herein.

One possible failure criteria is whether the one-sigma value of the filtered second derivative of a sample exceeds the similarly calculated one-sigma value of an average passing sample by a factor of, for example, 3, 4.5, or 6 (comparing absolute values).

As used herein, the "one-sigma value" of a data set is the standard deviation of that data set. The standard deviation for a set of values may be calculated by taking the square root of the average of the squared deviations of the values from their average value. The "three-sigma value" of a data set is three times the one-sigma value, and so on.

Another possible failure criteria is whether the filtered second derivative of a sample exceeds at any point the one-sigma value of a similarly measured data set of a passing sample by a factor of, for example, 3, 4.5, 6 or 20 (in terms of absolute value). In the examples below, and unless otherwise specified, the average one-sigma value of the filtered second derivative of a passing sample, measured at 1-minute intervals over a time period extending from 1 hour after burn-in to 24 hours after burn-in (see FIG. 3) is 0.05 V/sec$^2$. So, the failure criteria in this scenario using the three-sigma example is whether the open cell voltage of a different sample exceeds 0.15 V/sec$^2$ at any point.

In some embodiments, it is preferred to use the strictest failure criteria that passes most samples without defects. For example, if the "noise" in the filtered second derivative of a typical cell without defects approaches but does not exceed the three-sigma failure criteria, it is preferred to use the three-sigma failure criteria. More generally, it is preferred to use a failure criteria that passes an average passing sample by a small margin, for example 5%. Failures furthest from the mean are the worst in terms of contamination. So, such failures are most likely to fail other screens, such as a screen based on acceptance pulse. Using a strict failure criteria, such as a three-sigma criteria (0.15V) for the example described below, is most likely to detect failures with modest contamination not detectable by other screening methods.

EXAMPLES

Lithium SVO cells were fabricated and activated with electrolyte according to normal production procedures in a pilot line environment. The lithium SVO cells were then quickly (e.g., within 4 hours) attached to a voltmeter to measure open circuit voltage. Voltage measurements were taken at 60 second intervals for a time period of at least 24 hours (86,400 seconds), to obtain open cell voltage as a function of time. A numerical first derivative function was calculated at each point by dividing the voltage difference to the next point by the time difference to the next point. This derivative was then filtered using a linear time invariant low pass filter. A numerical second derivative function was calculated by performing this calculation again on the resulting filtered first derivative. How to calculate first and second derivatives is well known, and any suitable method may be used. The resulting second derivative was then filtered, in this case using the same linear time invariant low pass filter, in order to accentuate the signal. This filter added constants to the three most recent forward time steps and two most recent backwards output steps in order to produce a new output value. Constant values ranged from about –0.6 to 1.5, but summed to one for the entire expression.

Figure 2:
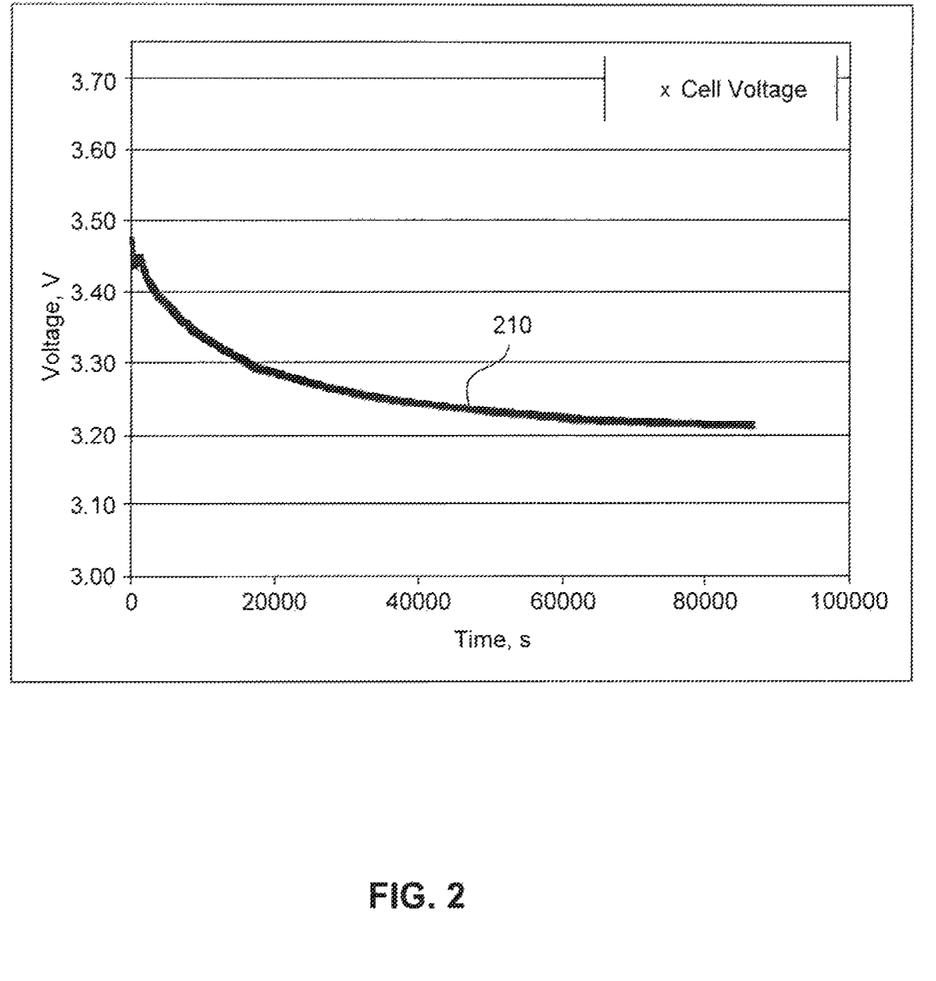
FIG. 2 shows a plot of open cell voltage versus time for a battery cell shortly after activation, in which a failure criteria is present.

FIG. 2 shows a voltage versus time plot 210 for a first Lithium SVO cell fabricated and measured as described above. The cell exhibits a discontinuity in the voltage versus time curve. This discontinuity can be seen through visual observation as a change in slope in the time region 0-10,000 seconds.

Machine learning image detection methods could also be used to detect this change in slope without human involvement, although such methods were not actually used in this set of examples. Machine learning is commonly used today to read license plates, mail addresses, and other curve recognition applications. The machine learning code would simply need to be trained to detect discontinuous curves (curves with irregular bends or kinks) from smooth ones. Examples of machine learning techniques suitable for use with the current disclosure are setforth in, e.g., Faster and Better: A Machine Learning Approach to Corner Detection, IEEE Transactions on Pattern Analysis and Machine Intelligence, Volume 32 Issue 1, January 2010, pages 105-119 and Computer Vision—ECCV 2006: 9th European Conference on Computer Vision, Graz, Austria, May 7-13, 2006, Proceedings, Part III (Lecture Notes in Computer Science) 2006th Edition, Machine Learning for High-Speed Corner Detection, Edward Rosten and Tom Drummond, p. 430-441, each of which is herein incorporated by reference in its entirety. Simple numerical analysis of the voltage versus time curve may also be used to detect the presence of a first order discontinuity, i.e., the change in slope.

Figure 3:
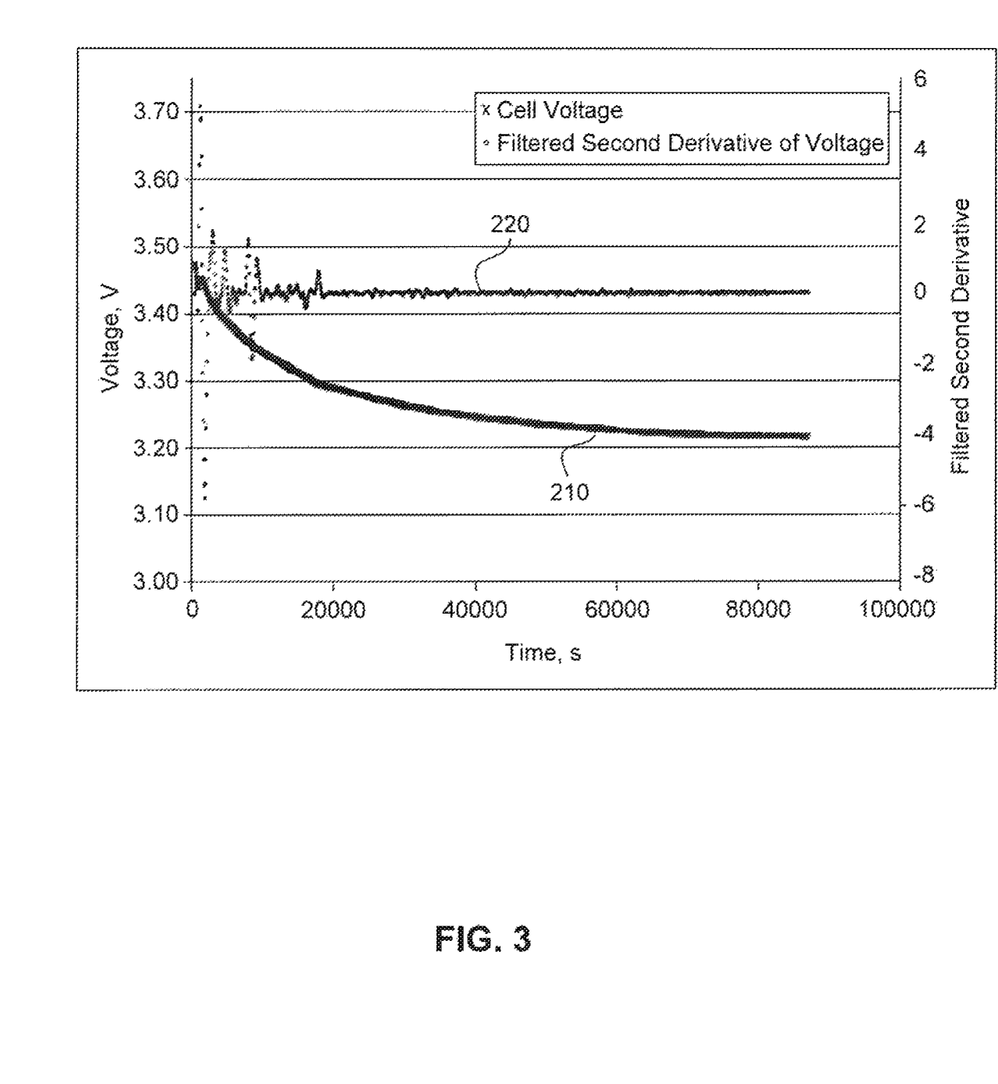
FIG. 3 shows plots of open cell voltage versus time, and the filtered second derivative thereof, shortly after activation, for the same battery cell as FIG. 2.

FIG. 3 shows voltage versus time plot 210, overlaid with the filtered second derivative 220 of plot 210. The filtered second derivative shows spikes in both the positive and negative direction having a magnitude of about 6 V/sec$^2$ in both directions where plot 210 has a first order discontinuity.

Figure 4:
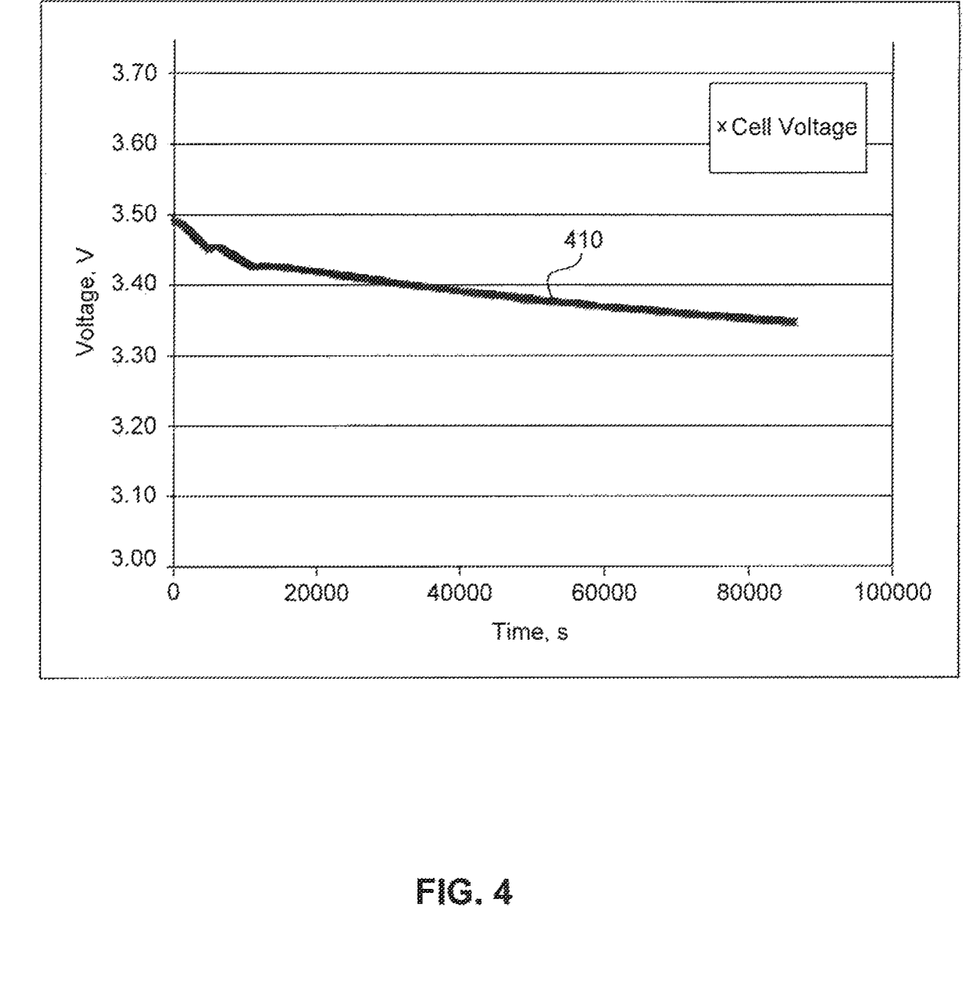
FIG. 4 shows a plot of open cell voltage versus time for a battery cell shortly after activation, in which a failure criteria is present.

FIG. 4 shows a voltage versus time plot 410 for a second Lithium SVO cell fabricated and measured as described above. The cell exhibits a discontinuity in the voltage versus time curve. This discontinuity can be seen through visual observation as a change in slope in the time region 0-10,000 seconds.

Figure 5:
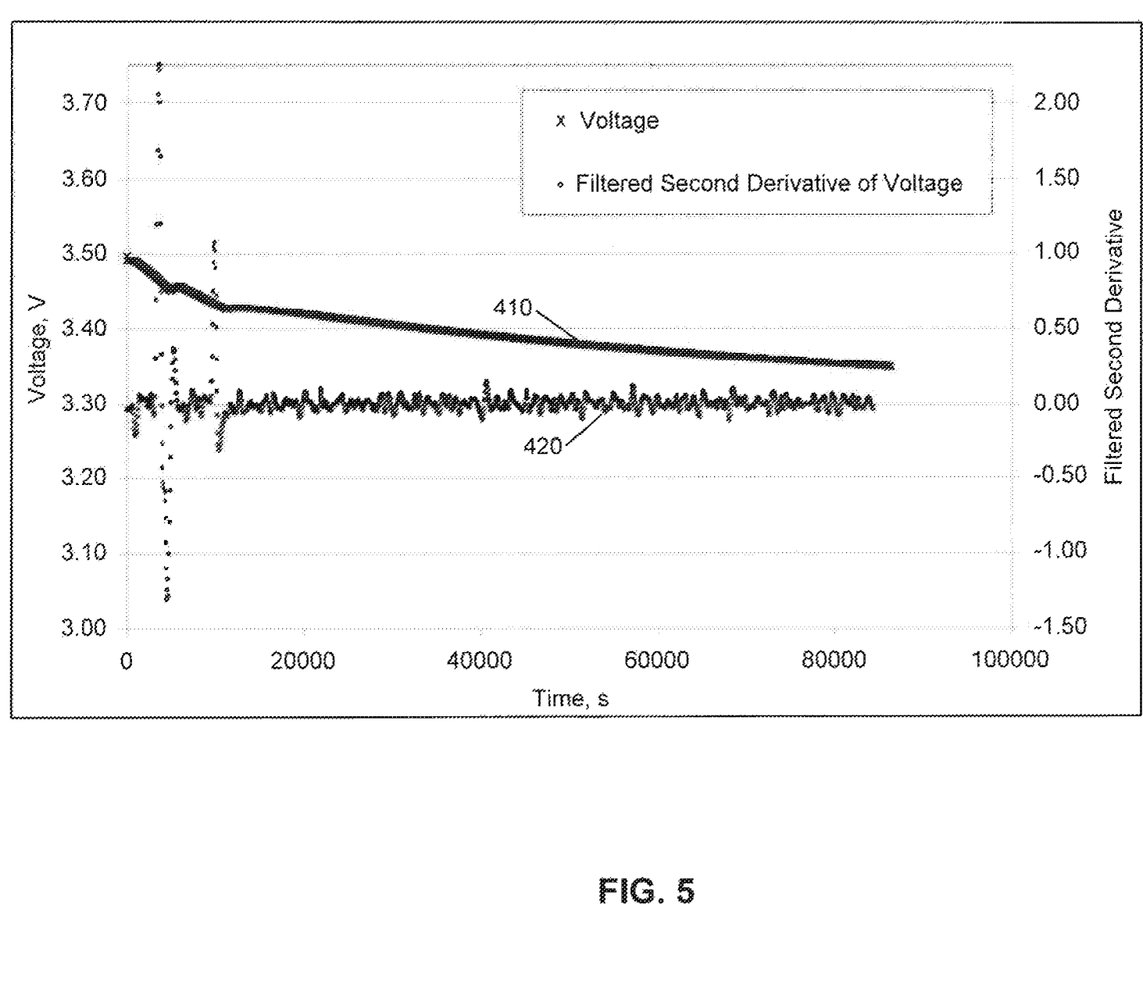
FIG. 5 shows plots of open cell voltage versus time, and the filtered second derivative thereof, shortly after activation, for the same battery cell as FIG. 4.

FIG. 5 shows voltage versus time plot 410, overlaid with the filtered second derivative 420 of plot 410. The filtered second derivative shows spikes in both the positive and negative direction having a magnitude of about 2.5 V/sec$^2$ in the positive direction and about 1.25 V/sec$^2$ in the negative direction where plot 410 has a first order discontinuity.

Figure 6:
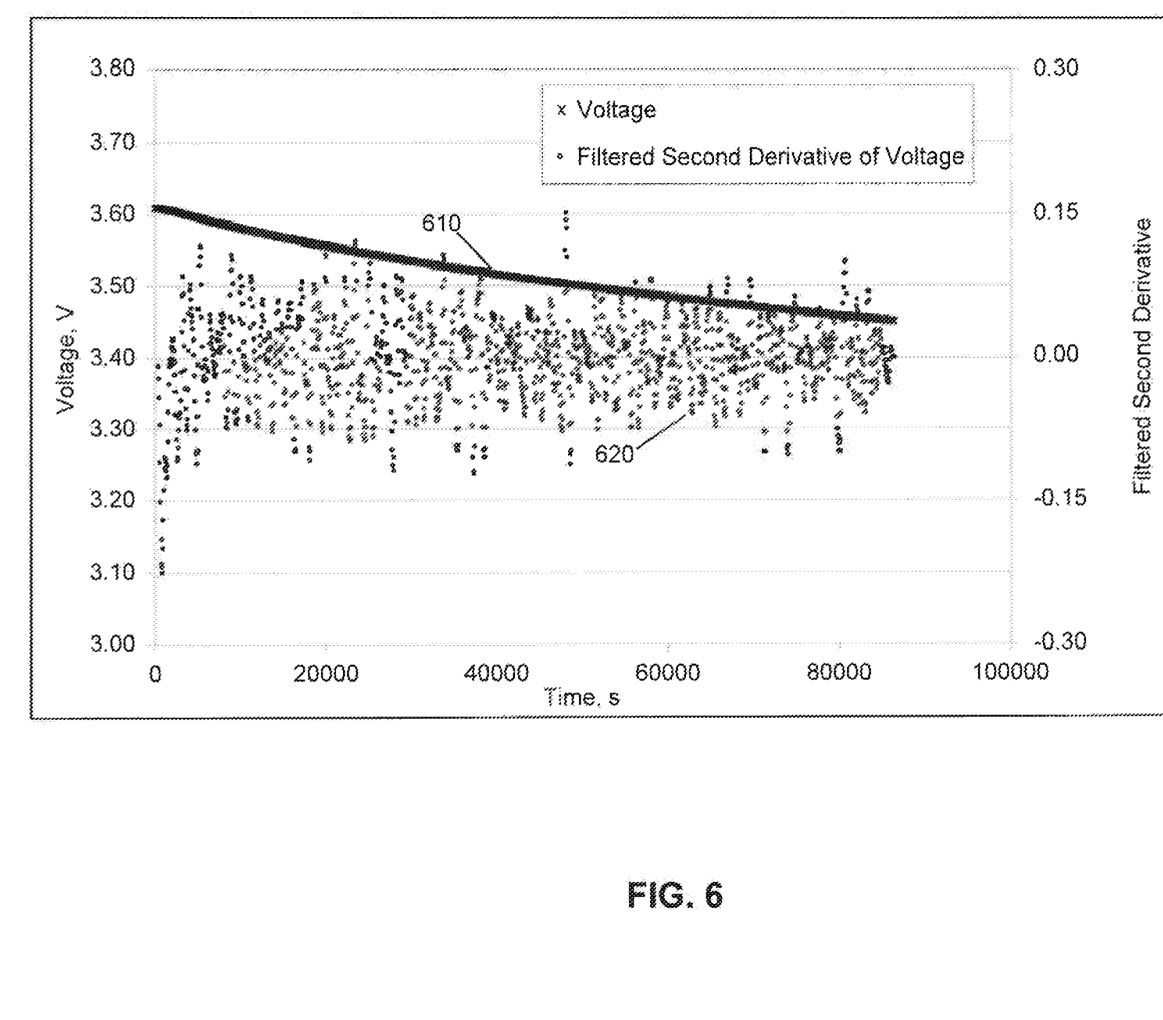
FIG. 6 shows plots of open cell voltage versus time, and the filtered second derivative thereof, shortly after activation, a battery cell where a failure criteria is not present.

FIG. 6 shows a voltage versus time plot 610 for a third Lithium SVO cell fabricated and measured as described above. The cell exhibits no discontinuity in the voltage versus time curve. FIG. 6 also shows the filtered second derivative 620 of plot 610. For the first 15 minutes or so of measured data, the third cell was not in thermal equilibrium, which resulted in filtered second derivative values as high as of 0.24 V/sec$^2$ in absolute value. Once thermal equilibrium is reached, the filtered second derivative shows only noise having a magnitude less than 0.15 V/sec$^2$ in both the positive and negative directions, consistent with the lack of a first order discontinuity in plot 610, i.e., plot 610 is a smooth curve without a sudden change in slope.

Tables 1 and 2 show the results of the destructive physical analysis of the first and second cells, respectively. The third cell was also subject to destructive physical analysis. No metal particles were detected in the third cell.

Table 1 contains the destructive physical analysis data for the first cell. Both Fe and Zn had developed as short circuit conditions across the cell stack. This data in Table 1 shows that the first order discontinuity of plot 210 correlates with the presence of harmful metal particles in the first cell.

TABLE 1

| Element | Fe | Zn |
| --- | --- | --- |
| Detected on Anode | Yes | Yes |
| Detected on Separator | Yes | Yes |
| Detected on Cathode | Yes | Yes |

Table 2 contains the destructive physical analysis data for the second cell. Destructive physical analysis indicated that Zn was present as an internal contaminant in the cell stack. This data in Table 2 shows that the first order discontinuity of plot 410 correlates with the presence of harmful metal particles in the second cell.

TABLE 2

| Element | Zn |
| --- | --- |
| Detected on Anode | Yes |
| Detected on Separator | Yes |
| Detected on Cathode | Yes |

Destructive physical analysis of the third cell indicated the absence of undesirable metal particles. This absence shows that the lack of a first order discontinuity in plot 610 correlates with the absence of harmful metal particles in the third cell.

Figure 7:
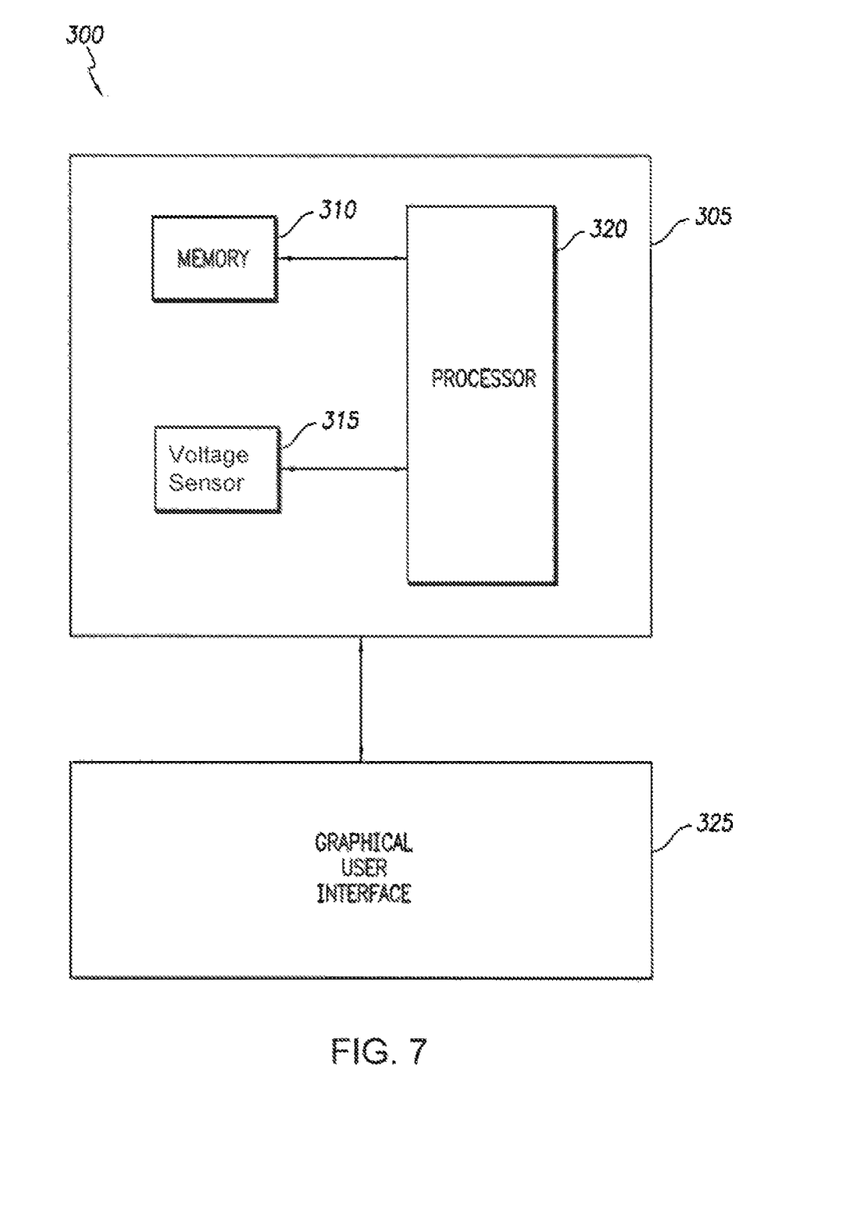
FIG. 7 illustrates an exemplary system for displaying voltmeter data.

FIG. 7 illustrates an exemplary system 300 for displaying voltmeter data, or data gathered by another voltage measuring device, from an electrochemical cell. Voltmeter 305 includes a voltage sensor 315 that may be attached to an electrochemical cell in order to measure open circuit voltage over a period of time after activation of the cell. Voltmeter 305 includes a processor 320 coupled to a memory 310. Processor 320 processes voltage measurements. System 300 includes a graphical user interface 325 that may display voltage readings and analyses of voltage readings, such as plots illustrated in FIGS. 2-6, and/or a determination that the cell is suitable or not suitable for use, e.g., in an implantable medical device, based on failure criteria.

In an example implementation, processor 320 is configured to generate a plot of the data (open cell voltage versus time) and communicate the plot to graphical user interface 325 for display. Processor 320 can also be configured to calculate the first and second derivatives versus time of the data plot and communicate the results to graphical user interface 325 for display. A user may then check the display of the first and second derivatives versus time of the data plot to visually check for the presence of a first order discontinuity, as a sudden change in value of the first derivative, or a spike in the second derivative.

In addition to, or in lieu of, visual inspection, a first order discontinuity may be detected by processor 320 using numerical analysis and/or filtering techniques and the results of this analysis may be displayed using graphical user interface 325. In addition, as disclosed above, machine learning image detection methods could be used to detect changes in slope indicative of contamination without requiring human analysis.

Processor 320 may analyze the open circuit voltage data using failure criteria, e.g., whether the absolute value of the filtered second derivative exceeds a certain, e.gs., 0.15 V/sec$^2$, 0.19 V/sec$^2$, or 1.0V/sec$^2$. The failure criteria for a specific cell geometry may be input by a user into memory 310 or determined by processor 320 based upon experience viewing or analyzing data for the cell geometry, and/or statistical analysis of a number of samples. The number may be affected by a plurality of factors, such as the characteristics of the specific cell being measured, the frequency of data sampling, and the length of time during burn-in over which data is sampled. For any particular battery, and any sufficiently frequent measurement during burn-in, a reasonable failure criteria that quickly and easily distinguishes samples with and without contaminants, e.g., metal contaminants, may be determined by measuring and destructively analyzing a number of samples as described herein.

Processor 320 may also determine whether the one-sigma value of the filtered second derivative of a sample exceeds the similarly calculated one-sigma value of an average passing sample by a factor of, for example, 3, 4.5, or 6 (comparing absolute values) for use as failure criteria. If the failure criteria is present in the voltage versus time function, graphic user interface 325 may communicate this finding to a user, and/or voltmeter 305 may subject the cell to further screening and/or communicate with another automated feature to discard or recycle the cell.

Conclusion

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

While some embodiments herein may be described with respect to lithium-SVO batteries, the description of those embodiments may be applicable to other types of batteries that use SVO cathodes, or other electrochemical cells having a characteristic beginning of life OCV curve. For rechargeable cells, this curve may be obtained after initially charging the cells from a discharge state to the highest operational cell voltage.

What is claimed is:

1. A method comprising:
    activating an electrochemical cell;
    measuring the open circuit voltage of the cell over a period of time to determine a voltage versus time function,
        wherein the period of time starts after activating the cell; and
    screening the cell for the presence of a failure mechanism by checking the voltage versus time function for a failure criteria,
        checking the voltage versus time function for the failure criteria includes calculating a second derivative of the voltage versus time function, and
        checking the voltage versus time function for the failure criteria includes filtering the second derivative.

2. The method of claim 1, wherein checking the voltage versus time function for the failure criteria further comprises filtering the second derivative using a linear time invariant filter.

3. The method of claim 2, wherein the failure criteria is met where the absolute value of the filtered second derivative exceeds 0.15 V/sec$^2$ at any point in time.

4. The method of claim 2, wherein the failure criteria is met where the absolute value of the filtered second derivative exceeds 0.19 V/sec$^2$ at any point in time.

5. The method of claim 2, wherein the failure criteria is met where the absolute value of the filtered second derivative exceeds 1.0 V/sec$^2$ at any point in time.

6. The method of claim 1, wherein the time period for measuring the open circuit voltage of the cell is at least 20,000 seconds long.

7. The method of claim 1, wherein the voltage versus time function is determined by measuring an open circuit voltage of the cell for at least 100 different times between activating the cell and 24 hours after activating the cell.

8. The method of claim 1, wherein the failure criteria is met where the absolute value of the second derivative exceeds, at any point in the period of time, three times the one-sigma variation of an average passing sample.

9. The method of claim 1, wherein
    the failure mechanism is a mechanism by which the cell can fail after the screening.

10. The method of claim 9, wherein the voltage versus time function includes multiple open circuit voltage measurements taken between activating the cell and 24 hours after activating the cell.

11. The method of claim 10, wherein the voltage measurements start within 5 minutes of activating the cell.

12. The method of claim 9, wherein the voltage versus time function results from at least 100 open circuit voltage measurements taken between activating the cell and 24 hours after activating the cell.

13. The method of claim 9, wherein the failure mechanism is a mechanism that causes cells to short due to the presence of contaminants in the cell.

14. The method of claim 1, wherein the period of time starts within 5 minutes to two hours after activating the cell.

15. The method of claim 1, wherein the period of time starts after the cell reaches thermal equilibrium.

16. The method of claim 1, wherein the electrochemical cell is activated after the cell reaches thermal equilibrium.

17. The method of claim 1, further comprising charging the cells from a discharge state to a highest operational cell voltage, wherein the open circuit voltage of the cell is measured after initially charging the cells from the discharge state to the highest operational cell voltage.

18. The method of claim 1, wherein the failure criteria includes the presence of a first order discontinuity in the voltage versus time function.

* * * * *